Figure 1:
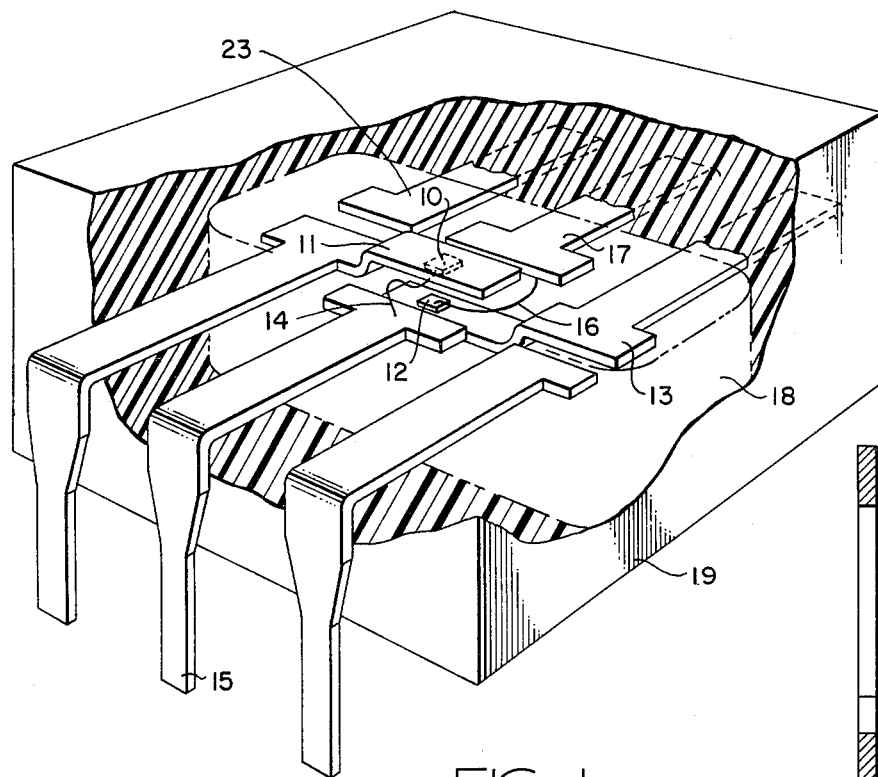

United States Patent [19]

Paxton, Jr. et al.

[11] 4,047,045
[45] Sept. 6, 1977

[54] OPTICAL COUPLER

[76] Inventors: Grady W. Paxton, Jr., P.O. Box 227, Allen, Tex. 75002; Bobby W. Howeth, 103 S. Lindale; Edward W. Mehal, 1110 Hamilton, both of Richardson, Tex. 75080; William F. Cashion, 5638 Anita St., Dallas, Tex. 75206; Charles M. Cashion, 103 Wake, Richardson, Tex. 75080

[21] Appl. No.: 701,895

[22] Filed: July 1, 1976

Related U.S. Application Data

[63] Continuation-in-part of Ser. No. 554,968, March 3, 1975, abandoned.

[51] Int. Cl.² .............................................. G02B 27/00
[52] U.S. Cl. ...................................... 250/551; 357/19
[58] Field of Search ............... 250/551, 239, 227, 552; 357/19

[56] References Cited

U.S. PATENT DOCUMENTS

| | | | |
|---|---|---|---|
| 3,639,770 | 2/1972 | Zizelmann | 250/551 |
| 3,660,669 | 5/1972 | Grexon | 250/239 |
| 3,893,158 | 7/1975 | Lincoln | 357/19 |
| 3,976,877 | 8/1976 | Thillays | 250/552 |

*Primary Examiner*—David C. Nelms

[57] ABSTRACT

Disclosed is an optical coupler apparatus comprising a photo-emissive device and a photo-sensitive device responsive to the wavelengths emitted by the source. The devices are mounted on frame leads with their major faces opposed and spaced apart. The optical devices and a substantial portion of the supporting frame leads are then encapsulated in a molded body of substantially electrically non-conductive material which is substantially transparent to the operative wavelengths of the optical devices. The transparent material not only fills the space between the optical devices but also provides structural support for the leads. The transparent material is then covered with an opaque coating or an additional body of opaque material molded over the body of transparent material.

15 Claims, 4 Drawing Figures

OPTICAL COUPLER

This is a continuation-in-part of co-pending application Ser. No. 554,968 entitled "Optical Coupler" filed Mar. 3, 1975, now abandoned, and assigned to the same assignee.

This invention relates to optoelectronic apparatus. More particularly, it relates to apparatus for optically coupling a photo-emissive device and a photo-sensitive device while maintaining electrical isolation therebetween.

Optical couplers of various designs are conventionally used in many applications. Generally such couplers are used to transfer signals from one circuit to another circuit where complete electrical isolation between the respective circuits is desired. Such couplers conventionally employ a solid state photo-emissive device, such as a light emitting diode or the like, which, when properly biased, emits photon energy; and a solid state photo-responsive device, such as a photo-responsive device, such as a phototransistor or the like, which is responsive to the optical wavelengths emitted by the source. The source and sensor are mounted in an encapsulation apparatus so that the light emitted by the source is readily absorbed by the sensor.

To insure electrical isolation between the active devices and their associated circuitry, the sensor and emitter are usually positioned with their major faces opposed and spaced apart by about 0.015 to about 0.050 inch and the space therebetween filled with a suitable electrically non-conductive medium which is transparent to the optical wavelengths of the optical devices. The devices are usually mounted on supporting frame leads which are encased in and supported by an electrically nonconductive medium which is opaque to the optical wavelengths of the optical devices. The leads extending from the body of the opaque supporting material may then be interconnected with suitable circuitry.

In conventional couplers of the type described the active elements are bodies of semiconductor material mounted on supporting lead frames with their respective major faces opposed and spaced apart by about 0.015 to 0.020 inch. The space between the opposed faces is filled with a transparent medium such as a silicone or the like.

The optical devices, the transparent medium therebetween and the associated lead frames are then encapsulated in a rigid opaque material, such as molded epoxy, which shields the devices from ambient light and provides structural rigidity for the leads extending therefrom.

While conventional couplers as described above are suitable for use in many applications, they are limited in the degree of electrical isolation provided. For example, such conventional couplers may routinely withstand voltage differences across the transparent medium of up to 2000 volts d.c. However, the electrical isolation generally breaks down when voltage differences greater than 2000 volts d.c. are applied. Moreover, when breakdown occurs the optoelectronic devices often suffer irreparable damage.

There is great need for optical couplers of the general type described providing electrical isolation between the optical devices, and hence between the associated circuitry, of up to 7000 volts d.c. However, such devices have heretofore not been available.

Briefly, in accordance with the present invention, photo-emissive and photo-sensitive devices are optically coupled in a package which provides the desired electrical isolation up to as high as 10,000 volts d.c. without damage to the active components. The active components as well as a substantial portion of the supporting frame leads are encapsulated in an optically transparent medium by transfer molding. The transparent medium thus provides structural rigidity to the apparatus and permits optical coupling between the active components. The coupler can be fabricated from conventionally available materials using conventional sensor and source pairs. Fabrication of the couplers can be accomplished with standard lead frame designs and the final product may be identical to conventional apparatus in physical size and appearance. However, because of the unique method and materials of construction, the couplers of the invention routinely provide complete electrical isolation between the optical devices and their associated circuitry of up to 7000 volts d.c. and often as high as 10,000 volts d.c.

Figure 2:
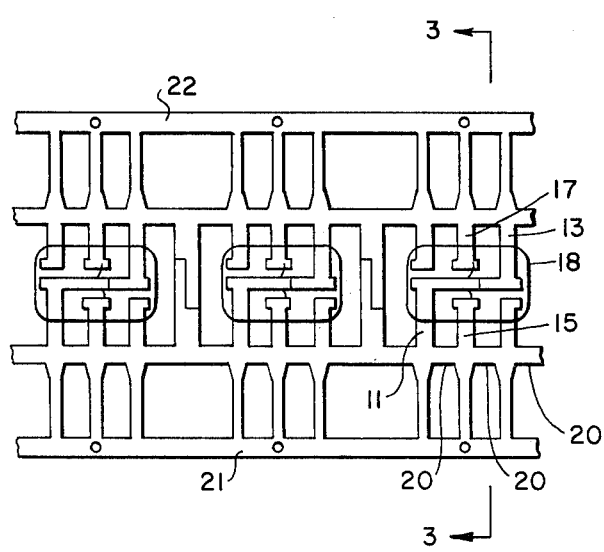
Figure 3:
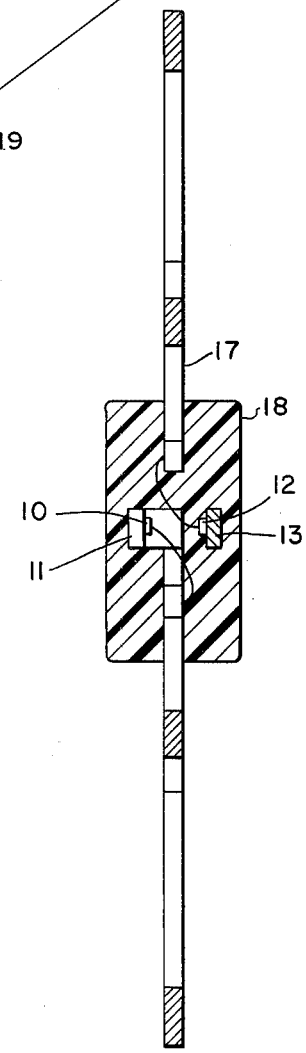
Figure 4:
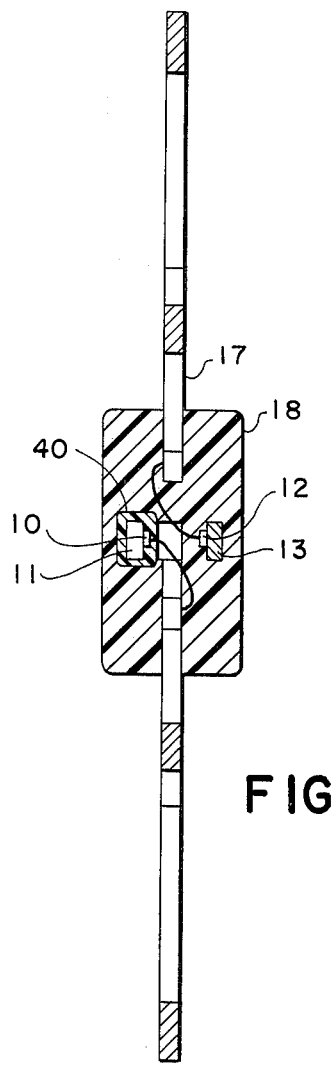

These and other features and advantages of the invention will become more readily understood when taken in connection with the appended claims and attached drawings in which:

FIG. 1 is a perspective view of an optical coupler fabricated in accordance with the invention having a portion of the electrically insulating material broken away to illustrate the internal arrangement of the components;

FIG. 2 is a top plan view of a plurality of the couplers of the invention during the fabrication process illustrating the placement of the transparent supporting medium, FIG. 3 is a sectional view of the apparatus of FIG. 2 taken through the line 3—3, and FIG. 4 is a sectional view of the apparatus of FIG. 2 taken through the line 3—3 showing a resilient coating surrounding the photo-emissive body.

Since the invention relates to the encapsulation structure of otherwise conventional photo-emissive and photo-responsive devices on conventional frame leads to form an optical coupler, detailed description of the active components will not be undertaken herein. Instead, the invention will be described with reference to photo-emissive and photo-responsive devices conventionally used in optical couplers of the general type described above. It is to be understood, however, that the principles of the invention are equally applicable to various pairs of optical sources and sensors which may be used in optically coupled arrangements.

Referring now to FIG. 1 an optical coupler comprising a photo-emissive device 10 mounted on a first beam lead 11 and a photo-responsive device 12 mounted on a second beam lead 13 is illustrated. The photo-emissive device 10 may be any suitable device which emits photon energy when properly biased. For example, a gallium arsenide photodiode comprising contiguous layers of N-type and P-type conductivity forming a P-N junction therebetween may be used for the source 10. Conventionally the P-type surface is bonded to the first beam lead 11 and a lead 14 bonded to the exposed N-type surface provides electrical connection to a third beam lead 15.

The photo-responsive device 12 may be nay suitable device responsive to the photon energy emitted by the photo-emissive device 10. The photo-responsive device 12 may be, for example, a phototransistor, photodiode or the like.

In the preferred embodiment the photo-emissive device 10 is a gallium arsenide light emitting diode and the photo-responsive device is a silicon phototransistor comprising a body of suitably doped N-type material having base and emitter regions formed therein. In the embodiment illustrated the surface of the N-type collector region is bonded directly to the second beam lead 13 and lead 16 is bonded to the emitter region providing electrical contact with the fourth beam lead 17. It will be readily appreciated, of course, that the arrangement of leads providing electrical connection between the active device bodies and the frame leads may be varied as desired to provide any required external pin polarity arrangement in the finished apparatus.

In the arrangement illustrated first beam lead 12 and second beam lead 13 extend in opposite directions from the body of the coupler and have parallel extensions extending 90° from the central axis of the lead on which the photo-emissive device 10 and photo-responsive device 12, respectively, are mounted. Accordingly, when the devices are mounted on the beam leads, the exposed major faces of the photo-emissive device 10 and the photo-responsive device 12 are opposed and spaced apart by a distance of about 0.015 to 0.020 inch. In accordance with the invention, the ends of the beam leads and the devices attached thereto are encapsulated in a substantially electrically non-conductive material which is transparent to the operative wavelengths of the devices forming an encapsulation body 8 as will be more fully described hereinafter.

As illustrated in FIG. 2 the preferred embodiment of the invention is fabricated by bonding a photo-emissive device 10 on each first beam lead 11 in a lead frame network 21. The lead frame network comprises a plurality of leads interconnected by support tabs 20. A photo-emissive device 10 is bonded to each first beam lead 11 and a lead 14 secured between the photo-emissive device and the third beam lead 15. Likewise, a photo-responsive device 12 is bonded to each second beam 13 in a second lead frame network 22. A lead 16 is then connected between the emitter region of the phototransistor and the fourth beam lead 17. If desired, the fifth beam lead may be electrically connected to the base region.

The lead frame networks 21 and 22 are placed in a suitable molding jig so that the beam leads in each network extend in opposite directions and each photo-emissive device 10 is in registry with and spaced from the photo-responsive device 12 by a space of about 0.015 to 0.020 inch.

The molding jig contains a plurality of cavities. Each cavity is spaced and configured to accommodate the ends of the beam leads on which the optoelectronic devices are mounted while permitting the remainder of the lead frame network to extend therefrom. The cavity is filled with a material which, when heated under pressure, forms an encapsulating body 18 which is substantially electrically non-conductive and substantially transparent to the operative wavelengths of the optical devices. It should be noted that the encapsulation body 18 is not only encloses the optical devices but also extends outwardly from the device in all directions sufficiently to form a unitary body which is free from any interfaces parallel to the optical path between the photo devices. Thus the transfer molded body encloses a substantial portion of each beam lead. The encapsulation body 18, therefore, provides structural support for the frame leads and maintains each lead in the desired position. Furthermore, the encapsulation body 18 completely encloses the active devices and a major portion of the supporting leads in a unitary body formed in a single molding operation, thereby completely sealing the active devices from environmental contaminants and avoiding the formation of any interface parallel with the optical coupling path.

The encapsulation body 18 may thereafter be coated with an opaque coating to shield the optical devices from ambient light. Alternatively, the encapsulation body 18 may be enclosed in a second molded body of suitable opaque material to form an opaque body 19 as shown in FIG. 1. After the encapsulation process is complete, the network supporting the beam leads, including the support tabs 20, is removed leaving only the beam leads extending from the opposite sides of the molded body. The leads are then bent as shown in FIG. 1. It will be observed that each lead extending from the molded body is supported by the transparent encapsulation body. Furthermore, the leads associated with the photo-emissive device 10 extend from the body in a direction opposite to the leads associated with the photo-sensitive body, thus are completely isolated from the leads associated with the photo-sensitive device 12. The beam leads, therefore, are juxtaposed and spaced apart only in the areas which support the device bodies. The area in which the device bodies are supported, therefore, is completely filled with a transparent molded epoxy and there are no interfaces in the proximity of the devices which extend parallel to the optical path or which extend directly from the lead supporting the other device.

In the preferred embodiment of the invention the encapsulation body 18 is formed by transfer molding using an epoxy compound such as Bisphenol A-Epichlorohydrin resin with suitable filler. A commercially available product suitable for this purpose is sold by the Hysol Division of the Dexter Corporation of Olean, N.Y. under the trade name MC-18. This product may be molded around the ends of the beam leads in a transfer mold at a temperature of about 154° C under a pressure of about 400 pounds per square inch for about 5 minutes to form a suitable rigid, transparent encapsulation body which provides electrical isolation up to 10,000 volts d.c.

In the preferred embodiment as illustrated in FIG. 1, the transparent encapsulation body 18 is itself encapsulated in a second molded body 19 which is opaque to the operative wavelengths of the optical devices. The opaque body is preferrably formed by molding a suitable epoxy compound such as Epoxy Novolac Resin wih suitable fillers and dye. A commercially available product suitable for this purpose is sold by the Morton Chemical Co. under the trade name EMC 480. This product may be molded around the transparent body 18 in a suitable transfer mold at a temperature of about 171° C under pressure of about 800 pounds per square inch for about 2 minutes.

It will be readily recognized that the physical relationship of the leads and active devices in the coupler of this invention is substantially the same as that of conventional encapsulated photo-couplers. However, the encapsulation material, the method of forming the encapsulation body, and the physical placement of the transparent medium in accordance with the invention results in an optically coupled apparatus with surprisingly high electrical isolation properties. Conventional devices usually employ a transparent medium, such as silicone or the like, between the active devices. The transparent medium is conventionally applied in a liquid state by dipping or pour molding and does not encapsulate the active devices or the frame leads supporting the active devices. In contrast the couplers described herein employ an epoxy which is molded under pressure at elevated temperatures to form a rigid unitary body of rigid material completely encapsulating the active devices and a substantial portion of the ends of the leads supporting the devices which not only serves as the transparent medium but also provides integrity for the apparatus. Without being bound by any theory, it is believed that by forming the encapsulation body by transfer molding an epoxy, more complete curing is achieved which results in extremely high electrical isolation properties. For example, conventional couplers employ a silicone material between the active devices to provide a transparent medium. This conventional material, however, is not molded. Instead, the silicone is cured in air without pressure and does not provide structural support for the leads. The transparent material, the active devices, and the ends of the leads supporting the active devices are then encapsulated in a molded epxoy body which is opaque to the operative wavelengths of the active devices. The opaque body, therefore, supports the beam leads and provides structural rigidity to the apparatus. The opaque body also provides an interface between the opaque body and the transparent medium which is parallel with the optical path and directly between the leads supporting the devices.

The apparatus of the present invention eliminates the first transparent medium and uses a transparent epoxy to encapsulate and support the ends of the leads and the active devices. Since the body is transparent, optical coupling is accomplished through that portion of the body between the devices.

By eliminating the conventional transparent material and using a single large body of transfer molded transparent material to provide both the structural support for the beams and the transparent medium, breakdown paths between the supporting body and the transparent medium are completely eliminated. For example, in conventional couplers the non-molded silicone or the like used for the transparent medium only occupies the space immediately between the opposed faces of the active bodies. This transparent medium is completely surrounded by a molded body of opaque material which provides structural support for the beams. Accordingly, the interface between the molded opaque body and the transparent medium parallels the optical coupling path and completely surrounds the optical path in the area directly between the active bodies. Thus the interface provides a parallel breakdown path. By eliminating the interface, these potential breakdown paths are eliminated.

It is believed that molding the body 18 under heat and pressure also provides more complete curing, thus resulting in better electrical isolation properties. Since the transpar medium and the encapsulation and support body are of the same material and formed as a unitary body, interface breakdown paths are eliminated and the optical path is provided by a molded body of superior electrical isolation properties. Any or all of these factors may be partially responsible for increasing the electrical isolation characteristics of the apparatus produced. Surprisingly, however, couplers of this construction routinely provide electrical isolation up to 7000 volts d.c. and frequently provide isolation up to 10,000 volts d.c.

While the invention has been described with particular reference to the use of a single body of transparent molded material to provide both structural support and the optical coupling medium, it should be noted that forming a rigid transfer molded body adjacent the face of the photo-emissive body often places mechanical stresses on the photo-emissive body. Such mechanical stresses frequently cause degradation of the optical output of the photo-emissive device.

In the preferred embodiment of the invention as illustrated in FIG. 4 undue mechanical stresses in the photo-emissive body can be avoided by coating the photo-emissive body with a resilient coating 40 which is transparent to the optical wavelengths of the device. Such a resilient coating may be formed by spraying or dipping the end of beam lead 11 and photo-emissive body 10 with a suitable transparent coating before the transparent body 18 is formed. A resilient transparent coating 40 may be formed, for example, by dipping the end of lead 11 with body 10 mounted thereon in a silicone elastomer. A layer of the silicone elastomer adheres to the dipped portion and is air cured to form a relatively thin layer of resilient transparent material covering the photo-emissive body. This resilient layer 40 is then totally encapsulated within the molded transparent body 18 and provides a resilient layer between the molded body and the photo-emissive body, thereby avoiding placing any stress on the photo-emissive body when the molded body is formed.

In the preferred embodiment the resilient coating is formed by dipping the photo-emissive body in a silicone elastomer sold by Dow Corner under the designation RTV 3140, diluted. This material is used in conventional optical couplers to provide the entire optical coupling medium. In accordance with the present invention, however, the resilient coating material 40 is only a relatively thin coating and does not extend to the photo-responsive device. Since the layer is fully surrounded by the molded transparent body 18 and does not extend to the photo-responsive body, no interface breakdown paths are formed between the active bodies or between the beam leads. If desired, the photo-responsive body may likewise be protected with a resilient coating (not shown). In all such cases, however, the resilient coating does not extend from one body to another or from one lead to another, thus potential breakdown interfaces between the transparent molded body and the transparent resilient layer are avoided.

While the invention has been described with specific reference to a particular epoxy for use as the transparent body, it will be readily understood that other moldable materials which are substantially transparent to the optical wavelengths of the devices employed may be used so long as the material provides the required electrically non-conductive properties. Likewise, various combinations of photo-emissive and photo-responsive devices other than those described in detail may be used. Therefore, it is to be understood that although the invention has been described with particular reference to specific embodiments thereof, the forms of the invention shown and described in detail are to be taken as preferred embodiments of the same, and that various changes and modifications may be resorted to without departing from the spirit and scope of the invention as defined by the appended claims.

What is claimed is:

1. Apparatus comprising:
   a. a photo-emissive body mounted on a first beam,
   b. a photo-responsive body mounted on a second beam electrically isolated from said first beam and spaced therefrom, said photo-emissive and photo-responsive bodies mounted in opposed relationship with a space therebetween, said first and second beams extending in opposite directions from said bodies and juxtaposed in spaced relationship only in the areas supporting said bodies, and
   c. a rigid unitary body of substantially electrically non-conductive transfer molded material substantially transparent to the operative wavelengths of said photo-emissive and photo-responsive bodies formed in the space between said bodies and extending outwardly from said bodies and surrounding sufficient portions of said beams to provide structural rigidity to said apparatus and maintain the separation between said bodies, thereby avoiding the formation of any interface extending substantially parallel with the optical path between said photo-emissive body and said photo-responsive body.

2. Apparatus as defined in claim 1 including a substantially electrically non-conductive material substantially opaque to the operative wavelengths of said photo-emissive and photo-responsive bodies enclosing said rigid body.

3. Apparatus as define in claim 1 wherein said rigid body of substantially electrically non-conductive material is a body of transfer molded epoxy.

4. Apparatus as defined in claim 3 including a body of transfer molded epoxy substantially non-conductive and substantially opaque to the operative wavelengths of said photo-emissive and photo-responsive bodies enclosing said rigid body.

5. Apparatus as defined in claim 1 including a resilient layer between said photo-emissive body and said rigid unitary body.

6. In an optical coupler including a photo-emissive device and a photo-responsive device positioned in spaced relation with each other and attached to supporting leads extending in different directions from said coupler and in register with each other only in the area surrounding the photo-emissive and photo-sensitive devices, the improvement comprising a unitary transfer molded body of substantially electrically non-conductive material substantially transparent to the wavelengths of photon energy emitted by said photo-emissive device enclosing and completely surrounding said devices and asubstantial portion of the leads supporting said devices.

7. In the optical coupler defined in claim 6, a body of substantially electrically non-conductive material substantially opaque to the wavelengths of photon energy emitted by said photo-emissive device enclosing said unitary transfer molded body.

8. The improvement defined in claim 6 wherein said transfer molded body is a body of transfer molded epoxy.

9. The improvement defined in claim 8 wherein said transfer molded epoxy consists essentially of Bisphenol A-Epichlorhydrin and filler.

10. In the optical coupler defined in claim 6, a layer of resilient material between the surface of said photo-emissive device and the surrounding body of transfer molded material.

11. In the optical coupler defined in claim 6, a layer of silicone elastomer substantially transparent to the optical energy emitted by said photo-emissive device enclosing said photo-emissive device and completely enclosed within said unitary transfer molded body.

12. The method of forming an optical coupler comprising the steps of
   a. positioning a photo-emissive device on a supporting conductive lead and a photo-responsive device on a supporting conductive lead in spaced relation with the said devices in juxtaposition and spaced from each other and the supporting leads in juxtaposition only in the area surrounding said devices, and
   b. enclosing said devices and a substantial portion of said supporting leads in a unitary body of substantially electrically non-conductive transfer molded material which is substantially transparent to the optical energy emitted by said photo-sensitive device, whereby said substantially electrically non-conductive material provides support for said leads and provides an optical path between said devices free of any interface substantially parallel with said path in the proximity of said devices.

13. The method set forth in claim 12 wherein said body is formed by transfer molding an epoxy at elevated temperatures under pressure.

14. The method set forth in claim 12 including the step of enclosing said unitary body in a molded body of substantially electrically non-conductive material which is substantially opaque to the optical energy emitted by said photo-emissive device.

15. The method set forth in claim 12 including the step of covering the surface of said photo-emissive device with a layer of resilient material before enclosing said devices in said unitary body.

* * * * *

UNITED STATES PATENT OFFICE
CERTIFICATE OF CORRECTION

Patent No. 4,047,045          Dated September 6, 1977

Inventor(s) Grady W. Paxton, Jr., et al.

It is certified that error appears in the above-identified patent and that said Letters Patent are hereby corrected as shown below:

Column 1, line 21, delete "such as a photo-responsive device".

Column 2, line 66, "nay" should read -- any --.

Column 3, line 31, "body 8" should read -- body 18 --.

Column 5, line 13, after "provides" insert -- structural --.

Column 5, line 26, "epxoy" should read -- epoxy --.

Column 5, line 62, "transpar" should read -- transparent --.

Column 6, line 35, "Corner" should read -- Corning --.

Column 7, line 31, "define" should read -- defined --.

Column 7, line 35, after "substantial" insert -- electrically --.

Column 8, line 13, "A-Epichlorhydrin" should read -- A-Epichlorohydrin --.

Column 8, line 1, "asubstantial" should read -- a substantial --.

UNITED STATES PATENT OFFICE
CERTIFICATE OF CORRECTION

Patent No. 4,047,045  Dated September 6, 1977

Inventor(s) Grady W. Paxton, Jr., et al.

It is certified that error appears in the above-identified patent and that said Letters Patent are hereby corrected as shown below:

Column 8, line 35, "photo-sensitive" should read

-- photo-emissive --.

Signed and Sealed this

Twenty-fourth Day of January 1978

[SEAL]

Attest:

RUTH C. MASON  
Attesting Officer

LUTRELLE F. PARKER  
Acting Commissioner of Patents and Trademarks